United States Patent
Waardenburg et al.

(10) Patent No.: US 12,081,371 B2
(45) Date of Patent: Sep. 3, 2024

(54) DEVICE FOR CAN TRANSCEIVER, TRANSCEIVER AND METHOD

(71) Applicant: NXP B.V., Eindhoven (NL)

(72) Inventors: Cornelis Klaas Waardenburg, Zeeland (NL); Johannes Petrus Antonius Frambach, Nijmegen (NL); Stefan Paul van den Hoek, Winssen (NL); Rinke de Jong, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/059,595

(22) Filed: Nov. 29, 2022

(65) Prior Publication Data

US 2023/0179454 A1 Jun. 8, 2023

(30) Foreign Application Priority Data

Dec. 8, 2021 (EP) ..................................... 21213228

(51) Int. Cl.
*H04L 25/02* (2006.01)
*H03F 3/45* (2006.01)
*H04L 12/40* (2006.01)

(52) U.S. Cl.
CPC ...... *H04L 25/0276* (2013.01); *H03F 3/45511* (2013.01); *H04L 12/40* (2013.01); *H04L 2012/40215* (2013.01)

(58) Field of Classification Search
CPC ................. H04L 25/0276; H04L 12/40; H04L 2012/40215; H04L 12/40032; H04L 25/0272; H04L 25/0278; H04L 25/0296; H03F 3/45511; H04B 3/548; H04B 1/40
See application file for complete search history.

(56) References Cited

U.S. PATENT DOCUMENTS

| | | | | |
|---|---|---|---|---|
| 4,943,739 | A * | 7/1990 | Slaughter | H04B 3/00 326/86 |
| 11,176,070 | B2 | 11/2021 | De Haas et al. | |
| 2017/0026037 | A1 | 1/2017 | Huang et al. | |
| 2018/0260353 | A1* | 9/2018 | de Haas | H04L 12/40032 |

FOREIGN PATENT DOCUMENTS

| | | |
|---|---|---|
| EP | 3373526 A1 | 9/2018 |
| EP | 3445003 A1 | 2/2019 |

* cited by examiner

*Primary Examiner* — Jung Kim

(57) ABSTRACT

An attenuation device for a CAN transceiver comprises two device output nodes configured to electrically couple the attenuation device via the device output nodes between two transceiver terminals of the CAN transceiver. The attenuation device is configured to change from a first device state to a second device state when a common mode voltage is applied to the device output nodes that is either greater than a first reference voltage or less than a second reference voltage that is less than the first reference voltage. The attenuation device causes a first electrical output resistance at each device output node during the first device state and causes a second electrical output resistance at each device output node during the second device state in which the second output resistance is less than the first output resistance.

19 Claims, 8 Drawing Sheets

DEVICE FOR CAN TRANSCEIVER, TRANSCEIVER AND METHOD

CROSS-REFERENCE TO RELATED APPLICATIONS

This application claims the priority under 35 U.S.C. § 119 of European patent application no. 21213228.6, filed Dec. 8, 2021 the contents of which are incorporated by reference herein.

BACKGROUND OF THE INVENTION

Technical Field

The disclosed invention relates to a device for a CAN transceiver. Furthermore, the disclosed invention relates to a transceiver comprising the device and to a corresponding method.

Description of the Related Art

Controller area network (CAN) bus is a message-based communications bus protocol that is often used within automobiles. A controller area network (CAN) bus may form an example of an in-vehicle network (IVN) bus that can be used for communication within a vehicle. A CAN bus of a vehicle may include multiple bus devices, so called nodes or electronic control units (ECUs), such as an engine control module (ECM), a power train control module (PCM), airbags, antilock brakes, cruise control, electric power steering, audio systems, windows, doors, mirror adjustment, battery and recharging systems for hybrid/electric cars, and many more. The CAN bus protocol is used to enable communications between the various bus devices.

The data link layer of the CAN protocol is standardized as International Standards Organization (ISO) 11898-1:2003.

SUMMARY

Aspects of the disclosure are defined in the accompanying claims.

In a first aspect of this disclosure, an attenuation device for a CAN transceiver is provided. The attenuation device comprises two device output nodes configured to electrically couple the attenuation device via the device output nodes between two transceiver outputs of the CAN transceiver, wherein the attenuation device is configured to change from a first device state to a second device state in response to applying a common mode voltage to the device output nodes that is either greater than a first reference voltage or less than a second reference voltage, the second reference voltage being less than the first reference voltage, wherein the attenuation device is further configured to cause a first electrical output resistance at each device output node during the first device state, and wherein the attenuation device is configured to cause a second electrical output resistance at each device output node during the second device state, wherein the second output resistance is less than the first output resistance.

In one or more embodiments, the attenuation device is configured to sense a voltage at each device output node.

In one or more embodiments, the attenuation device is configured to change from the second device state to the first device state in response to applying a common mode voltage to the device output nodes that is less than the first reference voltage and greater than the second reference voltage.

In one or more embodiments, the attenuation device comprises an electrical circuit having a first branch and a second branch, wherein the first branch extends from the first device output node through a first electrical resistor and a first diode to a first reference voltage node of the circuit and from the second device output node through a second electrical resistor and a second diode to the first reference voltage node of the circuit, and wherein said second branch extends from said first device output node through the first resistor and a third diode to a second reference voltage node of the circuit and from said second device output node through the second resistor and a fourth diode to the second reference voltage node.

In one or more embodiments, wherein cathodes of the first and second diodes are each coupled to the first reference voltage node and anodes of the third and fourth diodes are each coupled to the second reference voltage node.

In one or more embodiments, wherein the first branch comprises a first transistor through which the first and second diodes are switchably coupled to the first reference voltage node, and wherein the second branch comprises a second transistor through which the third and fourth diodes are switchably coupled to the second reference voltage node.

In one or more embodiments, wherein the device is configured to be either enabled or disabled, and wherein the attenuation device is configured to perform the change from the first device state to the second device state solely when the attenuation device is enabled, and wherein attenuation device is always in the first device state when disabled.

In one or more embodiments, wherein the attenuation device comprises a control input configured to receive a control signal from the CAN transceiver, the control signal being based on a digital input signal receivable by the CAN transceiver, and wherein the attenuation device is configured to perform the change from the first device state to the second device state according to the control signal.

In one or more embodiments, wherein the attenuation device is configured to control the first and second transistors according to the control signal to either enable or disable the attenuation device.

In one or more embodiments, wherein the attenuation device is configured to apply the first reference voltage to the gate of the first transistor and the second reference voltage to the gate of the second transistor upon enabling of the attenuation device.

In one or more embodiments, wherein the circuit of the attenuation device comprises a third branch and a fourth branch, wherein the third branch comprises a series connection of a third transistor, a third, electrical resistor and a fifth diode, the fourth branch comprising a series connection of a fourth transistor, a fourth electrical resistor and a sixth diode, the attenuation device being configured to control the third and fourth transistors according to the control signal, wherein the first transistor is coupled to the third branch such that the first transistor is controlled in accordance with a switching state of the third transistor, and wherein the second transistor is coupled to the fourth branch such that the second transistor is controlled according to a switching state of the fourth transistor.

In a second aspect of this disclosure, a transceiver is provided, the transceiver comprising two transceiver outputs configured for connection to CAN-BUS signal lines, and an attenuation device according the first aspect or according to any one of the preceding embodiments, the attenuation device being electrically coupled between the transceiver outputs of the transceiver via the device output nodes of the attenuation device.

In one or more embodiments, wherein the transceiver has a signal input for receiving a digital input signal, and wherein the transceiver is configured to generate a control signal based on the receivable input signal and to transmit the control signal to the control input of the attenuation device.

In one or more embodiments, wherein the transceiver is configured, when the digital input signal represents a bit sequence of a dominant bit and a subsequent recessive bit, to generate a CAN BUS signal at the transceiver outputs also representing the bit sequence, wherein the transceiver is configured to couple a third, electrical resistance at each of the transceiver outputs for the dominant bit, wherein the transceiver is configured to couple a fourth electrical resistance at each of the transceiver outputs for the recessive bit, wherein the third resistance is smaller than the fourth resistance, wherein the second resistance caused by the attenuation device in the second device state at each device node is greater than the third resistance and less than the fourth resistance, and wherein the transceiver is configured to control the attenuation device via the control signal such that the attenuation device is active during a predetermined time period at the beginning of a time interval associated with the recessive bit in the CAN BUS signal.

In a third aspect of this disclosure, a method for an attenuation device is provided, which comprises device output nodes configured to electrically couple the attenuation device via the device output nodes between two transceiver outputs of the transceiver, the method comprising the steps of: Sensing a common mode voltage at the device output nodes; Changing from a first device state of the attenuation device to a second device state of the attenuation device in response to the common-mode voltage becoming either greater than a first reference voltage or less than a second reference voltage, the second reference voltage being less than the first reference voltage; Causing a first electrical output resistance at each of the device output nodes when the attenuation device is in the first device state; and Causing a second, electrical output resistance at each of the device output nodes when the attenuation device is in the second device state, the second output resistance being less than the first output resistance.

In one or more embodiments, wherein the method further comprising the step: Changing from the second device state of the attenuation device to the first device state of the attenuation device in response to the common mode voltage becoming less than the first reference voltage and greater than the second reference voltage.

In a fourth aspect of the this disclosure, a computer program is provided, comprising executable instructions which, when executed by a processing unit, cause said processing unit to carry out a method of the kind set forth.

In a fifth aspect, a non-transitory computer readable media comprising a computer program comprising computer executable instructions which, when executed by a computer, causes the computer to perform a method of operating a transceiver, wherein the transceiver comprising: two transceiver terminals configured for connection to CAN-BUS signal lines, and a attenuation device, wherein attenuation device comprises two device output nodes, wherein the attenuation device being electrically coupled between the transceiver terminals of the transceiver via the device output nodes of the attenuation device, wherein the attenuation device is configured to change from a first device state to a second device state in response to applying a common mode voltage to the device output nodes that is either greater than a first reference voltage or less than a second reference voltage, the second reference voltage being less than the first reference voltage, wherein the attenuation device is configured to cause a first electrical output resistance at each device output node during the first device state, and wherein the attenuation device is configured to cause a second electrical output resistance at each device output node during the second device state, wherein the second output resistance is less than the first output resistance, and wherein the method comprising: (a) Sensing a common mode voltage at the device output nodes; (b) Changing from a first device state of the attenuation device to a second device state of the attenuation device in response the detected common-mode voltage becoming greater than a first reference voltage or less than a second reference voltage, the second reference voltage being less than the first reference voltage; (c) Causing a first, electrical output resistance at each of the device output nodes when the attenuation device is in the first device state; and (d) Causing a second, electrical output resistance at each of the device output nodes when the attenuation device is in the second device state, the second output resistance being less than the first output resistance.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

Figure 1:
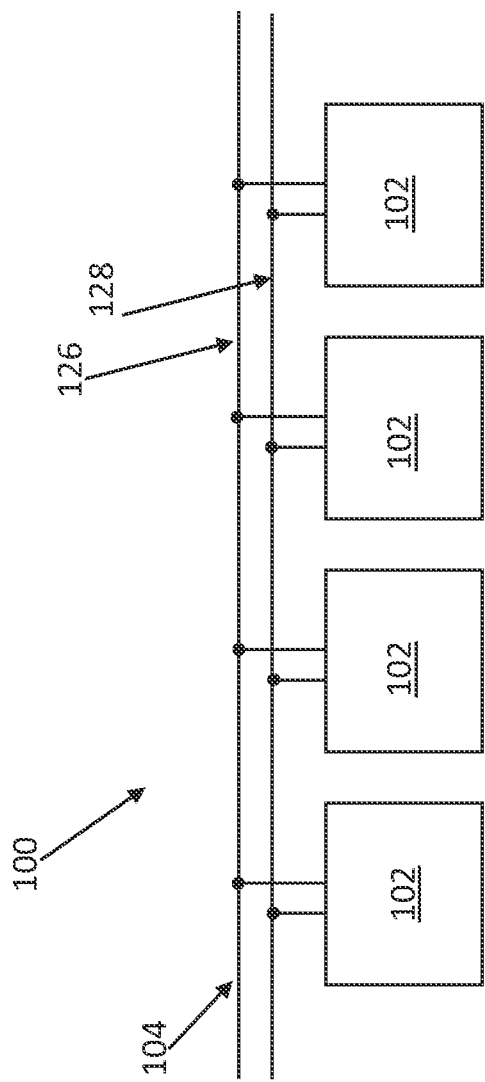
FIG. 1 illustrates an example schematic block diagram of a controller area network (CAN).

FIG. 1 illustrates an example schematic block diagram of a controller area network (CAN) 100 comprising a plurality of CAN devices, or nodes, 102, which are each coupled to a CAN bus 104. The CAN bus 104 comprises two signal lines 126, 128 for communicating a differential signal between the plurality of CAN devices 102. The signal lines 126, 128 may also be referred to as CAN BUS signal lines 126, 128, or vice versa. CAN BUS signal lines 126, 128 may also be referred to as BUS signal lines 126, 128.

Figure 2:
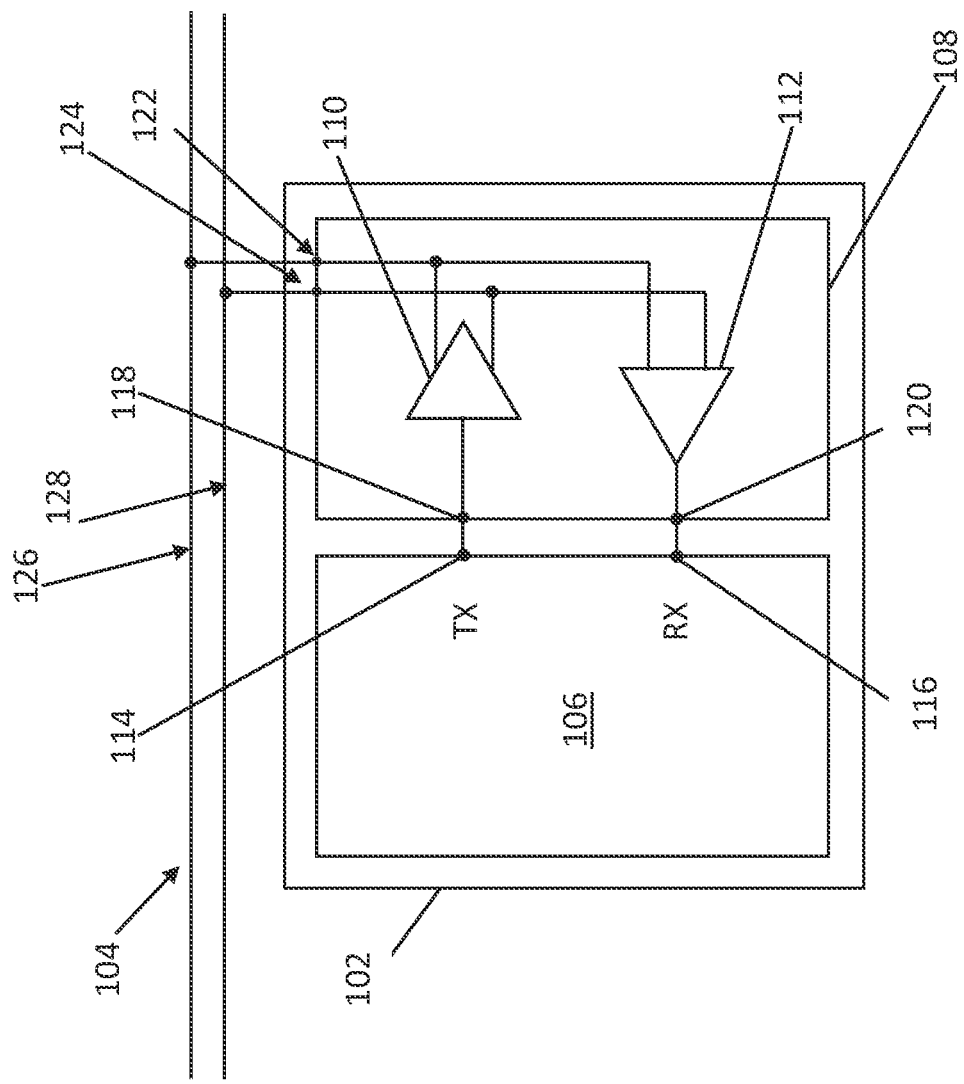
FIG. 2 illustrates a schematic block diagram of a CAN device 102 coupled to the CAN bus 104.

FIG. 2 illustrates a schematic block diagram of a CAN device 102 coupled to the CAN bus 104. The CAN device 102 comprises a CAN controller 106 and a CAN transceiver 108. The CAN transceiver 108 may be referred to as a transceiver 108, which may be configured to communicate with a CAN bus 104. The CAN controller 106 may be implemented by a processor, such as a microprocessor, configured to implement a CAN protocol of operation within the CAN network 100. The CAN transceiver 108 interfaces the CAN controller 106 with the CAN bus 104. In some examples, the CAN transceiver 108 can operate with no, or limited, circuitry for understanding or implementing the CAN protocol and so may be of relatively limited power consumption compared to the processor of the CAN controller 106.

The CAN controller 106 has a transmit output 114 and a receive input 116. The CAN transceiver 108 has a transmit input 118, a receive output 120 and two bus terminals 122, 124, which may also be referred to as a bus ports. The bus terminals 122, 124 are coupled to the two signal lines 126, 128 of the CAN bus 104. The transmitter output 114 of the CAN controller 106 is coupled to the transmit input 118 of the CAN transceiver 108. The receive input 116 of the CAN controller 106 is coupled to the receive output 120 of the CAN transceiver 108.

The CAN transceiver 108 preferably comprises a transmitter unit 110 and a receiver unit 112. The transmitter unit 110 may have an input coupled to the transmit input 118 of the CAN transceiver 108 and outputs connected to the CAN bus terminals 122, 124 of the CAN transceiver 108. The transmitter unit 110 may be configured to convert data received at the transmit input 118 of the CAN transceiver 108 to a differential signal at the CAN bus terminals 122, 124 for the CAN bus 104.

The receiver unit 112 may have inputs coupled to the CAN bus terminals 122, 124 and an output coupled to the receiver output 120 of the CAN transceiver 108. The receiver unit 112 is preferably configured to convert a differential signal, also referred to as a differential mode signal, on the CAN bus terminals 122, 124 and transmitted via the CAN bus 104 into data signal on the receiver output 120 for the CAN controller 106.

In a typical application, in which a CAN network is implemented within a vehicle, a large number of CAN devices 102, or nodes, may be provided.

Transceivers 108 are often used in an environment where electromagnetic interference exists. The electromagnetic interference may cause electrical disturbance signals on the signal lines 126, 128. A transceiver 108 coupled to the signal lines 126, 128 via the associated transceiver terminals 122, 124 may therefore be exposed to and affected by the disturbance signals. In order to better evaluate the possible influence of the disturbance signals on the operational behavior of the transceivers 108 prior to a practical application, simulations and practical tests are often carried out beforehand to test and evaluate a disturbance immunity of a CAN network 100 and the connected transceivers 108.

Figure 3:
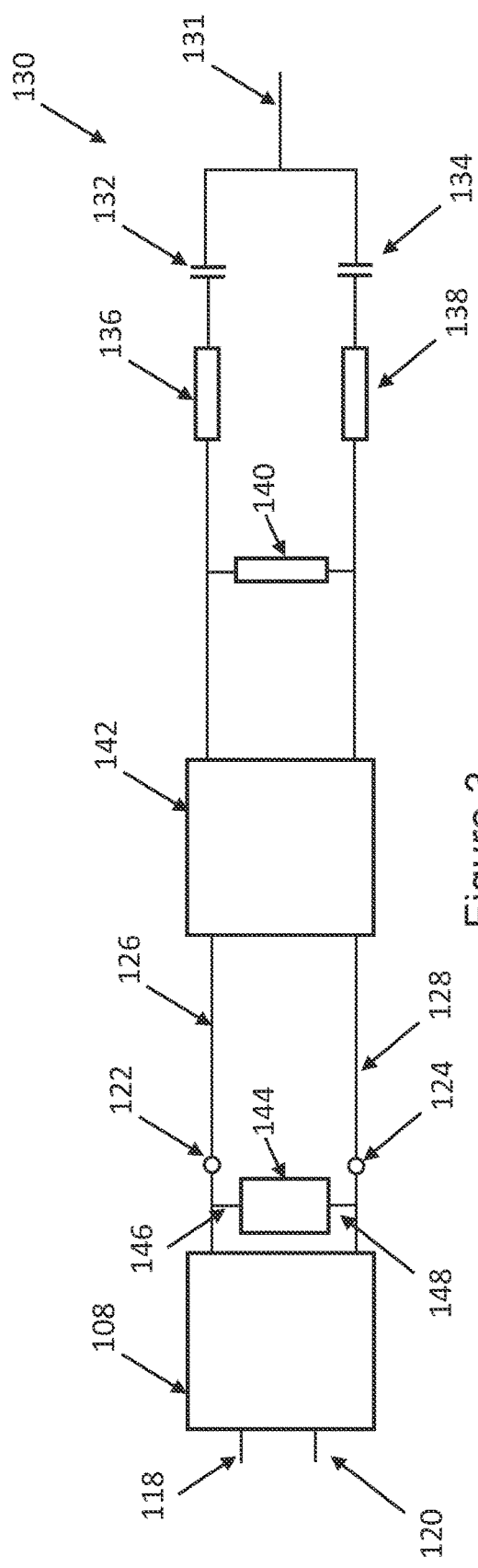
FIG. 3 illustrates a schematic block diagram of attenuation device 144 being connected to a CAN transceiver 108, which is coupled to a CAN test network.

To test the influence of disturbances in the form of a common-mode voltage on the signal lines 126, 128, the test circuit 130 shown schematically as an example in FIG. 3 can be used. This test circuit 130 is configured to apply a common mode voltage to both signal lines 126, 128. The test circuit 130 is preferably configured to generate a Direct Power Injection (DPI) test signal in the form of the common mode voltage and apply it directly or indirectly to the signal lines 126, 128 of the CAN network 100. The test circuit 130 is also referred to as a DPI network.

The test circuit 130 includes a terminal 131 for receiving a test signal. A first series circuit of a first test capacitor 132 and a first test resistor 136 and a second series circuit of a second test capacitor 134 and a second test resistor 138 are each connected to the terminal 131. The ends of the two series circuits facing away from the terminal 131 are coupled via a third test resistor 140. In addition, the latter two ends of the two series circuits are connected to input terminals of a common mode choke unit 142. The choke unit 142 is used to attenuate a common-mode signal, so that a signal attenuated by the common-mode component is output from the output terminals of the choke unit 142. Nevertheless, a remaining common-mode component may still be present at the output terminals of the choke unit 142. Signal lines 126, 128 of the CAN network 100 are connected to the output terminals of the choke unit 142. In the example shown schematically in FIG. 3, the signal lines 126, 128 extend, in a simplified view, from the choke unit 142 to the transceiver terminals 122, 124.

By coupling the test circuit 130 via the choke unit 142 and the signal lines 126, 128 to the transceiver terminals 122, 124, the test circuit's purpose is to generate a test disturbance signal in the form of a common mode voltage on the signal lines 126, 128 and to transmit it to the transceiver 108, the test disturbance signal being intended to represent an electrical disturbance signal caused by electromagnetic interference in practical use. If a corresponding test disturbance signal is applied to the signal lines 126, 128 by means of the test circuit 130, the operating behavior of the transceiver 108 can subsequently be observed and examined. In particular, the robustness of the transceiver 108 with respect to the test disturbance signal is examined.

In order to improve the robustness of the transceiver 108 against common-mode disturbance signals, which may at least partly pass the choke unit 142 and may reach the transceiver terminals 122, 124 by means of the signal lines 126, 128, an attenuation device 144 is proposed. The attenuation device 144 includes a first output node 146 and a second output node 148. The attenuation device 144 may be electrically coupled directly or indirectly between transceiver terminals 122, 124 through the two output nodes 146, 148. Preferably, the attenuation device 144 is configured to attenuate the common-mode disturbance signal arriving at transceiver terminals 122, 124 so that a useful signal actually arriving, for example, at transmission unit 110 of transceiver 108 is less disturbed and is preferably dominated by a differential useful signal, in particular in the form of a differential-mode signal. The use of the attenuation device 144 therefore results in improved robustness of the transceiver 108 with respect to common-mode disturbance signals that may reach the transceiver terminals 122, 124 via the signal lines 126,128.

Figure 4:
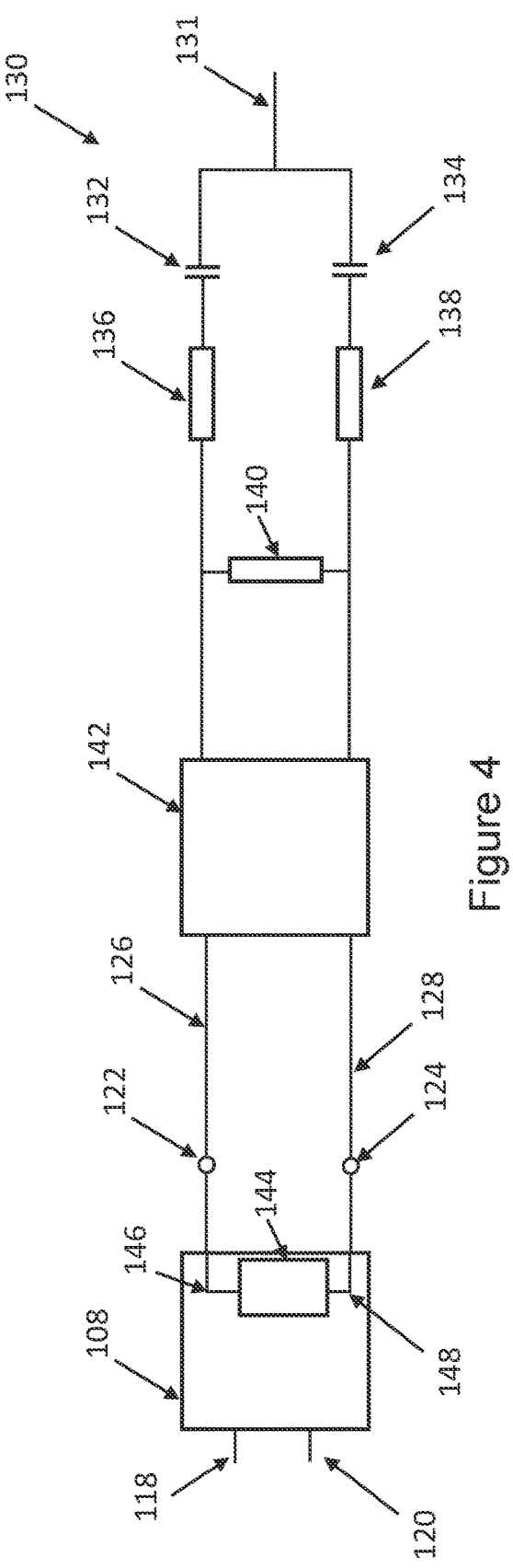
FIG. 4 illustrates a schematic block diagram of attenuation device 144 being part of a CAN transceiver 108, which is coupled to a CAN test network.

In FIG. 3, the attenuation device 144 is coupled to the transceiver terminals 122, 124 via associated output nodes 146, 148 without the attenuation device 144 forming or being required to form a part of the transceiver 108. The attenuation device 144 may be arranged and/or placed externally of the transceiver 108. However, the embodiment of the attenuation device 144 shown in FIG. 3 is only one of several possible arrangements or embodiments of the attenuation device 144. Another arrangement of the attenuation device is shown in FIG. 4, wherein the attenuation device 144 is configured as a component of the transceiver 108. In this case also, the output nodes 146, 148 of the attenuation device are electrically coupled to the transceiver terminals 122, 124. The transceiver 108 shown schematically in FIG. 4 may therefore be configured, for example, to have the attenuation device 144 as a component thereof. The following description of the attenuation device 144 may refer in an analogous manner to the attenuation device 144 shown in FIG. 3 and to the attenuation device 144 shown in FIG. 4, in this case as a component of the transceiver 108.

The attenuation device 144 is configured to change from a first device state to a second device state in response a common mode voltage being applied to the device output nodes 146, 148 that is either greater than a first reference voltage V1 or less than a second reference voltage V2, the second reference voltage V2 being less than the first reference voltage V1.

Preferably, the attenuation device 144 is configured to sense an electrical voltage at each of the two output nodes 146, 148. If the common mode component of the electrical voltage sensed at the two output nodes 146, 148 is either greater than the first reference voltage V1 or less than the second reference voltage V2, the attenuation device 144 may be configured to automatically change from the first device state to the second device state. The attenuation device 144 may further be configured to attenuate a common mode voltage applied to each of the two output nodes 146, 148 more in the second device state than in the first device state. The first reference voltage V1 and the second reference voltage V2 may be selected such that a differential, electrical voltage between the transceiver terminals 122, 124 for transmitting useful signals is at least substantially unaffected.

As a result, the attenuation device 144 offers the advantage that disturbances on the signal lines 126, 128 in the form of common-mode voltages may reach the transceiver terminals 122, 124, but can be attenuated at this point by the attenuation device 144. This results in an improved robustness of the operational behavior of the transceiver 108 with respect to disturbances on the signal lines 126, 128. In particular, the improved robustness is also given if the attenuation device 144 forms an integral part of the transceiver 108.

During practical investigations, it was found that the additional attenuation, as applied in the second device state of the attenuation device 144, does not necessarily have to act continuously in time. Rather, the change from the first device state to the second device state can be selected by the appropriate choice of the first reference voltage V1 and the second reference voltage V2 to ensure a suitable trade-off between robustness to disturbances in the form of common mode voltages on the signal lines 126, 128 and electrical power reduction due to attenuation of the signals on the signal lines 126, 128.

The attenuation device 144 is configured to cause a first electrical output resistance at each device output node during the first device state and to cause a second electrical output resistance at each device output node during the second device state, wherein the second output resistance is less than the first output resistance. The output resistance is preferably understood to be an electrical resistance. The first electrical output resistance can thus also be referred to as the first resistance. However, this resistance is hereafter referred to as the output resistance, since the output resistance can act on the respective node. In other words, the resistance seen in the first device state on each device output node may be referred to as a first output resistance, and the resistance seen in the second device state on each device output node may be referred to as a second output resistance. If a network is connected to a respective device output node, the resistance can also act on this network, in particular in order to attenuate a common mode disturbance. Device output node preferably means to be a node of the attenuation device that is configured to be electrically connected to a network outside the attenuation device. The resistance caused at each of the first and second device output nodes preferably refers to a resistance between the respective device output node and a reference potential, which is preferably a ground potential or other predetermined voltage potential. Thus, when reference is made to the causing of a resistance, in particular to the causing of the first resistance or to the causing of the second resistance, it may refer to exhibiting of an electrical resistance between the respective associated device output node and the reference potential. Exhibiting the respective resistance can be achieved by establishing an electrical conductive connection between the respective device output node and the reference potential via electrical components such as resistors, capacitors and/or coils, which individually or jointly form and/or include the respective electrical resistance. The establishment of the respective electrical connection may be switchable, for example, by closing or opening a switch integrated in the respective electrical connection. The switch may be formed by a semiconductor switch, in particular in the form of a transistor. If the switch is closed, the respective resistance is caused and/or exhibited thereby. If the switch is opened again, the effect occurs that the respective resistance is no longer caused and/or exhibited. The first output resistance can be formed by a first impedance. The second output resistance can be formed by a second impedance. In an example, it is preferably provided that the first impedance and the second impedance are each substantially characterized by an ohmic resistance. Therefore, this disclosure preferably refers to the first output resistance and the second output resistance. However, this preferably does not exclude that in the first device state a first impedance is acting which includes the first output resistance. Accordingly, in the second device state, it is preferably not excluded that a second impedance is acting which includes the second output resistance.

The first output resistance may be selected to be particularly high so that a particularly low attenuation of signals is caused by the attenuation device 144 in the first device state to both output nodes 146, 148 or at the transceiver terminals 122, 124. The second output resistance, on the other hand, can be selected to be low enough to be particularly effective in attenuating a common mode voltage applied to both of the two output nodes 146, 148 and the transceiver terminals 122, 124, respectively. To cause better attenuation, the second output resistance is smaller than the first output resistance. Preferably, the second output resistance is low enough to attenuate the common mode voltage at each of the two transceiver terminals 122, 124 sufficiently to ensure disturbance-error-free operation at the transceiver 108. The first output resistance and the second output resistance may each be formed or shaped by a resistor. However, it is also possible for the first output resistance and the second output resistance to be additionally or alternatively each formed by an active element that acts like an electrical resistor. Examples of such active elements include transistors or semiconductor circuits. The first output resistance and second output resistance can alternatively or additionally each be formed by an electrical impedance.

Provided that there is no common mode voltage or only a very small common mode voltage at each of the transceiver terminals 122, 124 or output nodes 146, 148, it is desirable for the attenuation device 144 to remain in or change to the first device state. A very small common mode voltage may be a common mode voltage that is very small compared to the differential mode voltage to represent a dominant bit, for instance the very small common mode voltage may be at least one order of a magnitude smaller that the differential mode voltage to represent a dominant bit. In fact, provided that there is no common mode voltage or only a small common mode voltage, it can often be considered that it is unlikely to cause a failure in the operational behavior of the transceiver 108. Therefore, attenuation device 144 is preferably configured to operate in the first device state when the common mode voltage applied to the device output nodes is less than the first reference voltage V1 and greater than the second reference voltage V2, (or to change back from the second device state to the first device state when the common mode voltage applied to the device output nodes reverts to being less than the first reference voltage V1 and greater than the second reference voltage V2). Provided that a common mode voltage is applied to the output nodes 146,148 which is between the two reference voltages V1, V2, a change to the first state can preferably be performed automatically by the attenuation device 144.

Figure 5:
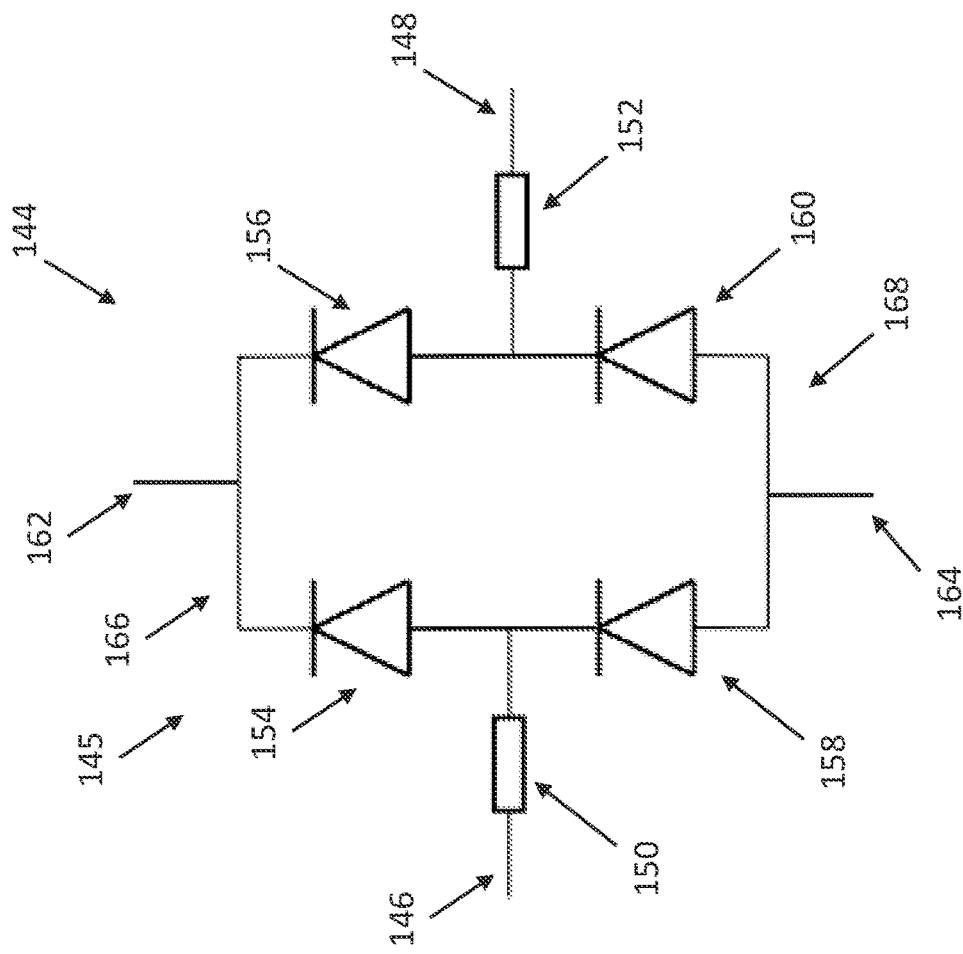
FIG. 5 schematically illustrates an example of an attenuation device 144.

FIG. 5 shows an illustrative example of an attenuation device 144 for attenuating common-mode disturbance signals according to the this disclosure. The attenuation device 144 comprises two device output nodes 146, 148 configured to electrically couple the attenuation device 144 via the device output nodes 146, 148 between two transceiver terminals 122, 124 of the transceiver 108. In this example, the attenuation device 144 also comprises an electrical circuit 145 having a first branch 166 and a second branch 168. The first branch 166 extends from the first device output node 146 through a first electrical resistor 150 and a first diode 154 to a first reference voltage node 162 of the circuit 145 and from the second device output node 148 through a second electrical resistor 152 and a second diode 156 to the first reference voltage node 162 of the circuit 145. The second branch 168 extends from said first device output node 146 through the first resistor 150 and a third diode 158 to a second reference voltage node 164 of the circuit 145 and from said second device output node 148 through the second resistor 152 and a fourth diode 160 to the second reference voltage node 164.

The first output node 146 of the circuit 145 of the attenuation device 144 may be electrically connected to the transceiver terminal 122. The second output node 148 of circuit 145 of the attenuation device 144 can be electrically connected to the transceiver terminal 124. The two connections may achieve the desired electrical coupling of the attenuation device 144 to the transceiver terminals 122,124.

The first reference voltage V1 may be applied to the first reference voltage node 162. The second reference voltage V2 may be applied to the second reference voltage node 164.

The first branch 166 comes into effect as follows: in the event that a disturbance signal in the form of a common-mode voltage is applied to the signal lines 126, 128, this common-mode voltage being greater than the first reference voltage V1, a voltage drop is generated between the first output node 146 and the first reference voltage node 162 (to which the first reference voltage V1 is applied), so that the first diode 154 is in forward bias. Current thus flows through the first resistor 150 and thus attenuates the common-mode voltage at the first output node 146. The disturbance-based common-mode voltage is applied in an analogous manner to the second output node 148 of the circuit 145, so that a voltage drop is generated between the second output node 148 and the first reference voltage node 162 so that the second diode 156 is also in forward bias. As a result, current thus also flows through the second resistor 152 and attenuates the common mode voltage at the second output node 148. The common mode voltage is thus simultaneously attenuated at both output nodes 146, 148, provided that the common mode voltage is greater than the first reference voltage V1.

The second branch 168 of the circuit 145 comes into effect as follows: provided that a disturbance signal in the form of a common-mode voltage is applied to the signal lines 126, 128, this common-mode voltage being smaller than the second reference voltage V2, a voltage drop is generated between the first output node 146 and the second reference voltage node 164 (to which the second reference voltage V2 is applied), so that the third diode 158 is in forward bias. As a result, the first resistor 150 comes into effect and thus attenuates the common-mode voltage at the first output node 146. The common-mode voltage is applied to the second output node 148 of the circuit 145 in an analogous manner, so that a voltage drop is generated between the second output node 148 and the second reference voltage node 164, so that the fourth diode 160 is also in the forward bias. As a result, the second resistor 152 comes into effect and attenuates the common-mode voltage at the second output node 148. Thus, the common-mode voltage is simultaneously attenuated at both output nodes 146, 148, provided that the common-mode voltage is smaller than the second reference voltage V2.

The first branch 166 and the second branch 168 do not have an effect, resulting in that no currents flow, in the event that the common-mode voltage is greater than the second reference voltage V2 and less than the first reference voltage V1.

Figure 6:
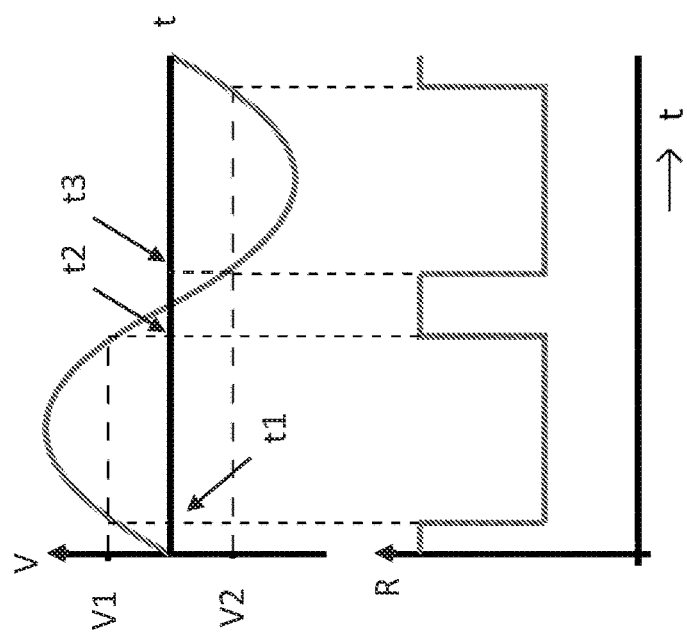
FIG. 6 schematically illustrates a signal graph.

In the upper half of FIG. 6 the voltage V is plotted versus time t and shows a sinusoidal waveform representing a common mode voltage for an example of a disturbance signal on signal lines 126, 128, where the amplitude of the sinusoidal waveform is intended to represent the same voltage at each of the two transceiver terminals 122, 124 (referenced to a ground—not shown). It should be noted that the common mode voltage represented by the sinusoidal waveform is not intended to necessarily represent the actual waveform of a common mode voltage in practice, but rather serves the purpose of illustrating the change in device states of the attenuation device 144. If the time course of the sinusoidal common mode voltage is followed, the common mode voltage reaches a voltage level corresponding to the first reference voltage V1 at time t1. It follows that the device state changes to the second device state, so that the second output resistance is caused at each of the two output nodes 146, 148. The second output resistance is smaller than the first output resistance. In the lower half of FIG. 6, which schematically plots output resistance R over time t, the transition from the (larger) first output resistance to the (smaller) second output resistance is shown in a schematic example, the transition occurring when the change from the first device state to the second device state occurs. As long as the common-mode voltage according to the sinusoidal waveform is greater than the first reference voltage V1, the effect at the two output nodes 146, 148 remains unchanged, namely the (smaller) output resistance (in form of the second resistance) acts at both output nodes, so that a higher attenuation effect is achieved.

It will be appreciated, that since reference voltage V1 is referenced preferably against a same ground (or local earth) level as the common mode voltage, the second output resistance is caused at the first output node 146 by the first resistor 150 in the example of circuit 145 shown in FIG. 5. At the second output node 148, on the other hand, the second output resistance is caused by the second resistor 152 in the example of the circuit 145 shown in FIG. 5. Thus, at each of the two output nodes 146, 148, a resistor 150, 152 acts to cause the second output resistance, respectively.

The sinusoidal waveform schematically shown in the upper half of FIG. 6 also shows a period between t2 and t3 in which the voltage level of the common mode voltage is between the first reference voltage V1 and the second reference voltage V2. During this period, in the example circuit 145 of FIG. 5, none of the diodes 154, 156, 158, 160 are in forward bias. Rather, all of said diodes 154, 156, 158, 160 are in the reverse direction, so that the respective associated reverse resistance of the diodes 154, 156, 158, 160 determines or substantially influences the first output resistance. The first output resistance thus acts between the first output node 146 and the first and/or second reference voltage V1, V2. The same first output resistance also acts between the second output node 148 and the first and/or second reference voltage V1, V2. Thus, at each of the two output nodes 146, 148, the circuit 145 and in particular the diodes 154, 156, 158, 160 act to cause the first output resistance, respectively. This (relatively high, with respect to the second output resistance) first output resistance is also schematically shown in the lower half of FIG. 6 for the time period between t2 and t3 in which the common mode voltage is between the first and second reference voltages V1, V2.

For transmitting payload data through the signal lines 126, 128 according to the commonly known CAN protocol, a differential voltage signal is generated between the signal lines 126, 128, where a voltage difference of 0 V represents a recessive bit and a voltage difference between 1.2 V to 3 V represents a dominant bit. The voltage in each of the two signal lines 126, 128 is typically between 0 V and 5 V. It has therefore been found to be advantageous if the first reference voltage is higher than 5 V and the second reference voltage is lower than 0 V, so as not to adversely affect the transmission of the payload data. For example, it may be provided that the first reference voltage is higher than 10 V, 15 V or 20 V. Furthermore, it may be provided, for example, that the second reference voltage is smaller than −5 V, −10 V, −15 V or −20 V. The specified limits for the first reference voltage and the second reference voltage are preferably not to be regarded as conclusive. Especially in view of the fact that possibly the voltage levels for representing payload data are changed or chosen differently, it is provided in an appropriate way that the first reference voltage and the second reference voltage adapt to this change.

With reference to FIG. 5, it was previously explained that the first reference voltage is applied to the first reference voltage node 162 and the second reference voltage is applied to the second reference voltage node 164. It is mentioned here merely as a precaution that, for simpler consideration, the voltage which can usually drop across diodes in the forward direction is neglected. However, the previously stated basic principle, as explained in connection with FIGS. 5 and 6, does not change when the forward voltage is considered in detail. As a part of the explanation of the basic principle, it was explained that, for example, the diode 154 is in forward bias when the voltage at the first output node 146 is higher than the first reference voltage at the first reference voltage node 162. At the same time, the diode 158 is in the reverse direction. Therefore, in an example of the attenuation device, cathodes of the first and second diodes 154, 156 are each coupled to the first reference voltage node 162 and anodes of the third and fourth diodes 158, 160 are each coupled to the second reference voltage node 164.

In another example of the attenuation device 144, it may be provided that the first diode 154 and the second diode 156 are each directly or indirectly electrically connected to the first reference voltage node 162 via their respective cathodes. In principle, a respective direct electrical connection may be used. However, it is also possible to make the coupling of the first reference voltage node 162 to the cathodes of the first and second diodes 154, 156 switchable. The same applies to the third and fourth diodes 158, 160 with respect to the second reference voltage node 164. Here, too, the third and fourth diodes 158, 160 can be electrically connected directly or indirectly to the second reference voltage node 164. Therefore, in principle, a direct, electrical connection can be applied in each case. However, it is also possible to make the coupling of the second reference voltage node to the anodes of the third and fourth diodes 158, 160 switchable. The switchable connections may allow to enable or disable the attenuation device 144.

Figure 7:
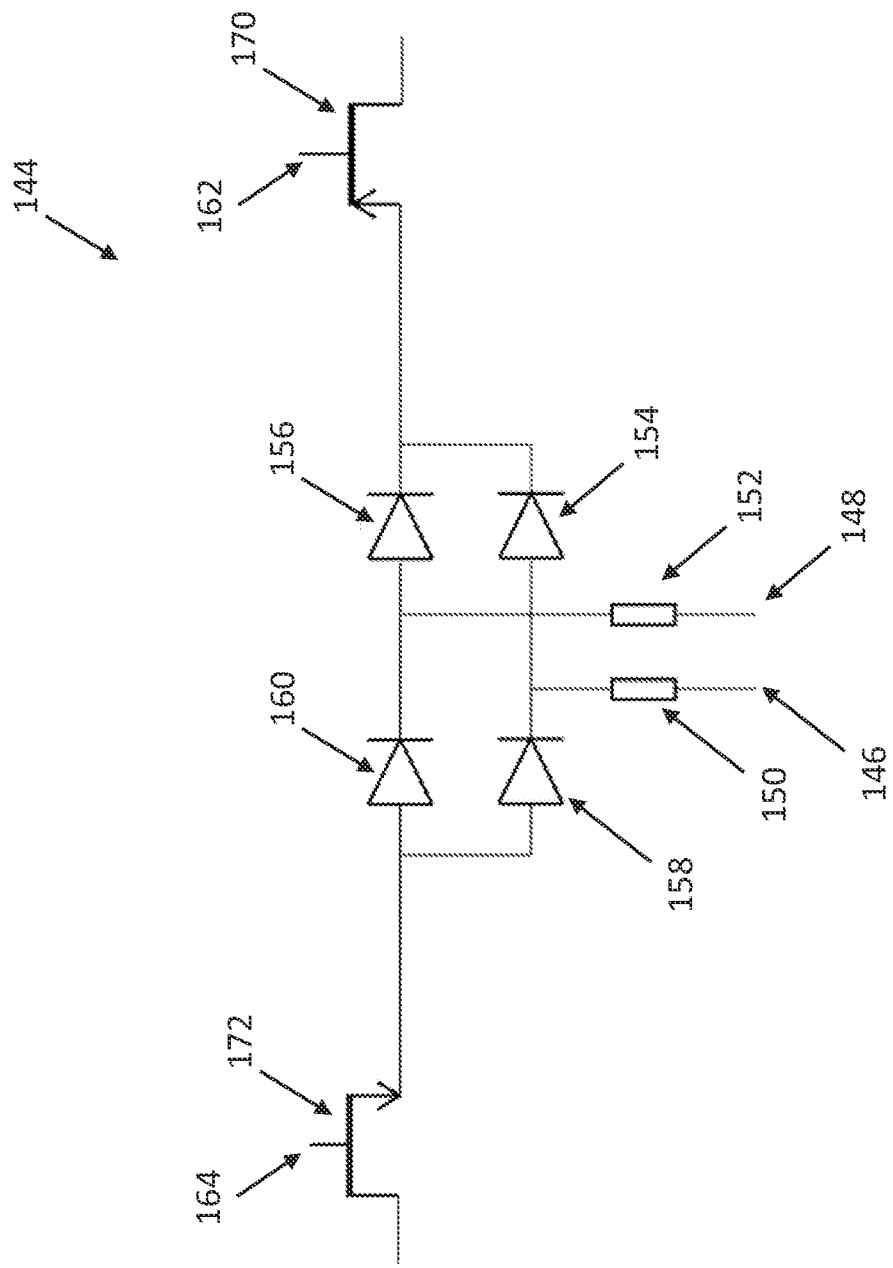
FIG. 7 schematically illustrates another example of an attenuation device 144.

In another example of the attenuation device 144 as schematically illustrated in FIG. 7, it may be provided that the first branch 166 comprises a first transistor 170 through which the first and second diodes 154, 156 are switchably coupled to the first reference voltage node 162, and wherein the second branch 168 comprises a second transistor 172 through which the third and fourth diodes 158, 160 are switchably coupled to the second reference voltage node 164. The first transistor 170 is preferably designed as a PMOS. The second transistor 172 is preferably designed as an NMOS.

Preferably, the source node of the first transistor 170 is connected to the cathodes of the first and second diodes 154, 156. Preferably, the gate node of the first transistor 170 is electrically connected to the first reference voltage node 162. The drain node of the first transistor 170 is preferably electrically connected to a reference potential, in particular electrical ground. In this example, although the cathodes of the first and second diodes 154, 156 are coupled to the first reference voltage node 162 via the first transistor 170, there is no direct electrical connection between the cathodes of the first and second diodes 154, 156 and the first reference voltage node 162 in any switching state of the first transistor 170. The coupling of the cathodes of the first and second diodes 154, 156 to the first reference voltage node 162 can thus be configured as an indirect coupling. The first reference voltage applied to the gate node of the first transistor 170 via the first reference voltage node can be used to determine the switching state of the first transistor 170 so that it either electrically connects the drain node of the first transistor 170 (and thus preferably the reference potential, in particular ground) to the source node of the first transistor 170 or electrically disconnects the drain node of the first transistor 170 from the source node of the first transistor 170. The switching state of the first transistor 170 can be determined by the voltage drop between the source node of the first transistor 170 and the gate node of the first transistor 170. Via the first reference voltage, which can be applied to the gate node of the first transistor 170 by means of the first reference voltage node 162, the switching behavior of the first transistor 170 can thus be determined. The first reference voltage can thus also be used to determine when the attenuation device 144 changed from the first device state to the second device state to cause the second output resistance at the first output node 146.

The gate node of the second transistor 172 is preferably electrically connected to the second reference voltage node 164. The drain node of the second transistor 172 is preferably electrically connected to the same reference potential, in particular electrical ground. In this example, although the anodes of the third and fourth diodes 158, 160 are coupled to the second reference voltage node 164 via the second transistor 172, there is no direct electrical connection between the anodes of the third and fourth diodes 158, 160 and the second reference voltage node 164 in any switching state of the second transistor 172. The coupling of the anodes of the third and fourth diodes 158, 160 to the second reference voltage node 164 can thus be configured as an indirect coupling. The second reference voltage applied to the gate node of the second transistor 172 via the second reference voltage node can be used to determine the switching state of the second transistor so that it either electrically connects the drain node of the second transistor (and thus preferably the reference potential, in particular ground) to the source node of the second transistor or electrically disconnects the drain node of the second transistor from the source node of the second transistor. The switching state of the second transistor can be determined by the voltage drop between the source node of the second transistor and the gate node of the second transistor. Via the second reference voltage, which can be applied to the gate node of the second transistor 170 by means of the second reference voltage node 164, the switching behavior of the second transistor 172 can thus be determined. The second reference voltage can thus also be used to determine when the attenuation device 144 changed from the first device state to the second device state to cause the second output resistance at the second output node 146.

In another example of the attenuation device 144, the attenuation device 144 is configured to be either enabled or disabled, and wherein the attenuation device 144 is configured to perform the change from the first device state to the second device state solely when the attenuation device 144 is enabled; and wherein the attenuation device is always in the first device state when disabled.

Provided that the attenuation device 144 is disabled, the attenuation device 144 is prevented from changing from the first device state to the second device state. Enabling or disabling the attenuation device 144 can therefore be used to determine when the attenuation device attenuates possible disturbance signals in the form of common mode voltages on the signal lines 126, 128. Enabling or disabling of the attenuation device 144 may be performed, for example, via the gate nodes of the two transistors 170, 172. For example, if no influence of the attenuation device 144 is desired during a time period of transmission of payload signals over the signal lines 126, 128, the attenuation device 144 may be disabled during said time period.

In another example, the attenuation device 144 may comprise a control input configured to receive a control signal from the transceiver 108, the control signal being based on a digital input signal receivable by the transceiver 108, and wherein the attenuation device 144 is configured to perform the change from the first device state to the second device state according to the control signal.

Unless the attenuation device 144 forms an integral part of a transceiver 108, the control signal may be transmitted from the transceiver 108 to the control input of the attenuation device 144 via a control line. However, as can be seen schematically from FIG. 4, it is also possible for the attenuation device 144 to form an integral part of the transceiver 108. In this case, the control signal may be transmitted internally within the transceiver 108 via the control input of the attenuation device 144 to the attenuation device. Thus, the control signal may also be understood as an internal control signal.

For transmission of a payload signal, typically a sequence of dominant and recessive bits is transmitted by respective differential voltage signals between the signal lines 126, 128 according to the CAN protocol. The transceiver 108 is typically configured such that to transmit a dominant bit, an output impedance at the transceiver terminals 122, 124 is made low impedance. To transmit a recessive bit, the transceiver 108 is typically configured to make the transceiver terminals 122, 124 high impedance. In practical investigations, it has been found that capacitive and/or inductive effects can occur on the signal lines 126, 128 during a change from a dominant bit to a recessive bit and/or during a phase immediately after the change to the recessive bit. The transceiver 108 typically includes a transmit input 118 configured to receive a transmit signal (TX signal). This transmit signal may be a digital input signal receivable by the transceiver 108. Based on the transmit signal, the timing of the change from a dominant bit to a recessive bit and/or the phase immediately after the change to the recessive bit may be determined. The transceiver 108 and/or the attenuation device 144 may be configured to perform this determination. In one example, the transceiver 108 may generate a control signal based on the transmitted signal that the transceiver 108 sends to the control input of the attenuation device 144 to enable or disable the attenuation device 144 at desired time intervals. However, in another example, it is also possible for the attenuation device 144 to receive the forwarded transmit signal from the transceiver 108 via the control input as a control signal, and the attenuation device 144 itself is configured to be enabled or disabled at a desired time based on the respective control signal.

In another example, the attenuation device 144 may be configured to control the first and second transistors 170, 172 according to the control signal to either enable or disable the attenuation device 144.

For example, the attenuation device 144 may be configured to be disabled to set each of the two transistors 170, 172 to the open switching state. This can effectively prevent a direct electrical connection from being made between the output nodes 146, 148 and the reference potential, particularly ground.

Furthermore, the attenuation device 144 may be configured to apply, for enabling, the first reference voltage to the first reference voltage node 162 connected to the gate node of the first transistor 170. The drain node of the first transistor 170 is preferably connected to ground (or local earth). Further, the attenuation device 144 may be configured to apply, for enabling, the second reference voltage to the second reference voltage node 164 connected to the gate node of the second transistor 172. The drain node of the second transistor 172 is preferably connected to ground (or local earth). It is therefore preferably provided that the attenuation device 144 is configured to apply the first reference voltage to the gate of the first transistor 170 and the second reference voltage 172 to the gate of the second transistor 172 upon enabling of the attenuation device 144.

Figure 8:
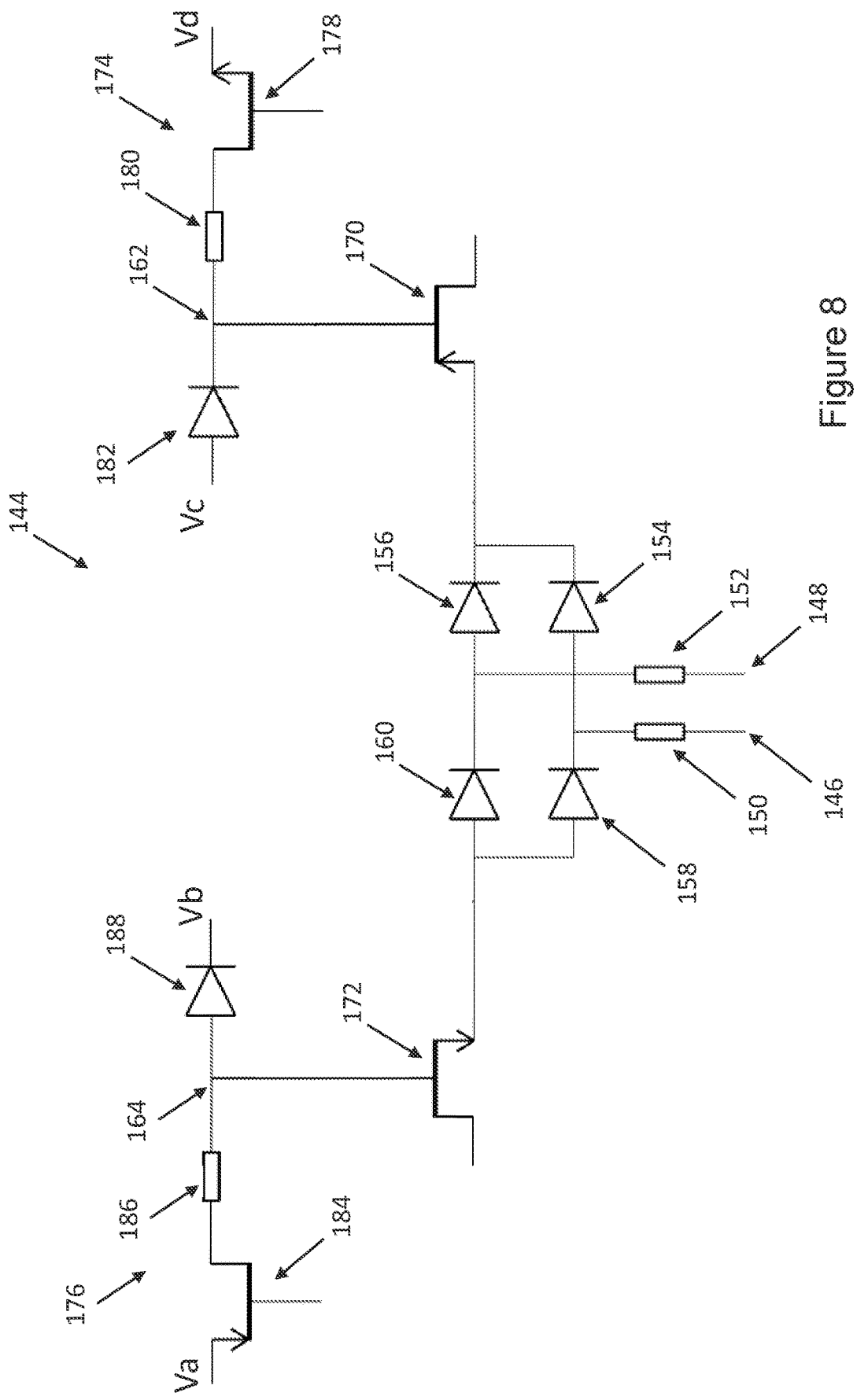
FIG. 8 schematically illustrates another example of an attenuation device 144.

Another example of the attenuation device 144 is schematically shown in FIG. 8. The attenuation device 144 is based on the previous explanation, in particular that relating to FIG. 7.

For the example illustrated in FIG. 8, it is provided for the attenuation device 144 that the circuit of the attenuation device 144 comprises a third branch 174 and a fourth branch 176. The third branch 174 comprises a series connection of a third transistor 178, a third electrical resistor 180 and a fifth diode 182, wherein the ends Va, Vb of the third branch 174 are connected to a voltage source configured to apply a predefined voltage across the third branch 174. The fourth branch 176 comprising a series connection of a fourth transistor 184, a fourth electrical resistor 186 and a sixth diode 188, wherein the ends Vc, Vd of the fourth branch 176 are connected to another or the same voltage source configured to apply another or the same predefined voltage across the fourth branch 176. Further, the attenuation device 144 being configured to control the third and fourth transistors 178, 184 according to the control signal, wherein the first transistor 170 is coupled to the third branch 174 such that the first transistor 170 is controlled in accordance with a switching state of the third transistor 178, and wherein the second transistor 172 is coupled to the fourth branch 176 such that the second transistor 172 is controlled according to a switching state of the fourth transistor 184.

It is also preferably provided that the gate node of the first transistor 170 is electrically connected to the first reference voltage node 162, which is preferably configured in the third branch 174 between the third resistor 180 and the fifth diode 182. By choosing appropriate voltage potentials at the ends Va, Vb of the third branch 174 as well as the third resistor 180, the first reference voltage can be set. By switching the third transistor 178 on or off, it can be enabled or disabled whether a change of the device state occurs according to the first reference voltage.

It is also preferably provided that the gate node of the second transistor 172 is electrically connected to the second reference voltage node 164, which is preferably configured in the fourth branch 176 between the fourth resistor 186 and the sixth diode 188. By choosing appropriate voltage potentials at the ends Vc, Vd of the fourth branch 176 as well as the fourth resistor 186, the second reference voltage can be set. The fourth transistor 184 can be used to enable or disable whether a change in the device state of the attenuation device 144 occurs according to the second reference voltage.

As explained before, when the transceiver 108 is switching to represent a recessive bit on the signal lines 126, 128, the output impedance on the transceiver terminals 122, 124 of the transmitter 108 becomes high ohmic. Due to the settling of possible parasitic capacitors of the transmitter output and the differential voltage (for representing the dominant bit) across potentially connected capacitors (so called EMI capacitors), which may be in the region of 4.7 nF, it may take several 100 nano seconds till the differential voltage is reduced to zero (thus changing from dominant bit representation to recessive bit representation). In order to increase the robustness of the transceiver 108, it may be desirable to reduce the settling time for the transition from representing a dominant bit to representing a recessive bit. During investigations, it was found that the robustness of the transceiver 108 can be increased when the capacitive effects at the beginning of the phase of representing the recessive bit are reduced. A vulnerable time window thus occurs just after a transition from the phase, where the dominant bit is represented which is also referred to the dominant phase, to a subsequent phase, where the recessive bit is represented which is also referred to as the recessive phase. As a result, a preferred time period to enable the attenuation device is when the transceiver switches its output at the transceiver terminals 122, 124 from representing a dominant bit to representing a recessive bit and preferably a short time period thereafter. Afterwards, the attenuation device 144 may automatically change back to the first state.

In an example of the transceiver 108, which preferably comprises the attenuation device 144, the transceiver 108 is configured, when the digital input signal represents a bit sequence of a dominant bit and a subsequent recessive bit, to generate a CAN BUS signal at the transceiver terminals 122, 124 also representing the bit sequence, wherein the transceiver 108 is configured to couple a third, electrical resistance at each of the transceiver terminals 122, 124 for the dominant bit. Furthermore, the transceiver 108 may be configured to couple a fourth electrical resistance at each of the transceiver terminals 122, 124 for the recessive bit, wherein the third resistance is smaller than the fourth resistance, wherein the second resistance caused by the attenuation device 144 in the second device state at each device node 146, 148 is greater than the third resistance and less than the fourth resistance, and wherein the transceiver 108 is configured to control the attenuation device 144 via the control signal such that the attenuation device 144 is active during a predetermined time period at the beginning of a time interval associated with the recessive bit in the CAN BUS signal.

In various examples, a predetermined time period may be at most 1000 nanoseconds, at most 500 nanoseconds or at most 200 nanoseconds. In another example, the predetermined time period may be at least 10 nanoseconds, at least 25 nanoseconds or at least 50 nanoseconds. In another example, the predetermined time period may be about 100 nanoseconds.

Figure 9:
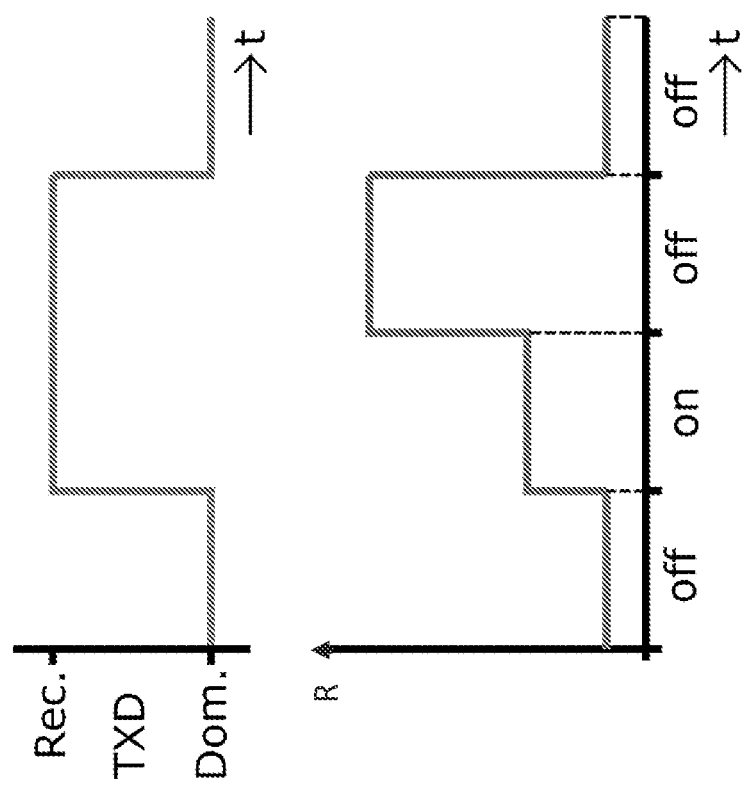
FIG. 9 schematically illustrates another signal graph.

In the upper half of FIG. 9, an exemplary and schematic signal pattern of the transmit signal is shown, representing a transition from a dominant bit to a recessive bit, and back. In the lower half of FIG. 9, the preferred electrically acting resistance R (which may be controlled by output resistance of the attenuator) at each of the two transceiver terminals 122, 124 is shown exemplarily and schematically.

As long as the transmit signal represents a dominant bit, a small impedance acts at each of the two transceiver terminals 122, 124. In order to prevent the impedance acting at the two transceiver terminals 122, 124 from immediately becoming high impedance when changing from the dominant bit to the recessive bit, it is provided in an advantageous example that the attenuation device 144 is active for a predetermined time at least during the initial phase of the period in which the recessive bit is to be represented at the transceiver terminals 122, 124. The active attenuation device 144 may cause, provided that a common mode voltage at the transceiver terminals 122, 124 is greater than a first reference voltage or less than a second reference voltage, a second output resistance to act at each of the transceiver terminals 122, 124. This second output resistance is preferably larger than the small resistance used to represent the dominant bit, and preferably smaller than the resistance used to represent the recessive bit. Thus, provided that the second output resistance comes into effect during the initial phase, the second resistance may cause rapid attenuation of disturbance signals on the signal lines 126, 128, which improves the robustness of the transceiver 108 to disturbance signals on the signal lines 126, 128.

Figure 10:
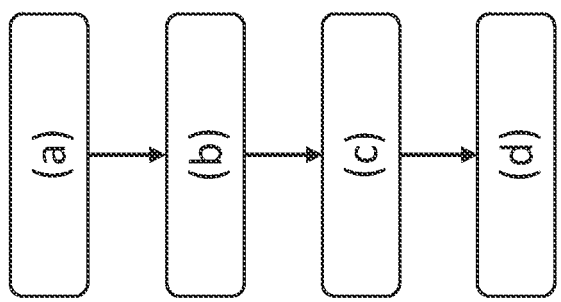
FIG. 10 depicts a simplified flow chart of an example of a method.

According to another example of this disclosure, a method for the attenuation device 144 is schematically illustrated in FIG. 10, the method comprising the steps of:
  (a) Sensing a common mode voltage at the device output nodes 146, 148;
  (b) Changing from a first device state of the attenuation device 144 to a second device state of the attenuation device 144 in response to the common-mode voltage becoming either greater than the first reference voltage or less than the second reference voltage, the second reference voltage being less than the first reference voltage;
  (c) Causing a first electrical output resistance at each of the device output nodes 146, 148 when the attenuation device 144 is in the first device state; and
  (d) Causing a second electrical output resistance at each of the device output nodes 146, 148 when the attenuation device 144 is in the second device state, the second output resistance being less than the first output resistance.

Although the described embodiments disclosed herein focus on devices, and a method for using same, the present invention is not necessarily limited to the example embodiments illustrate herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. An attenuation device for a controller area network ("CAN") transceiver, the attenuation device comprising:
   two device output nodes configured to electrically couple the attenuation device via the device output nodes between two transceiver terminals of the CAN transceiver;
   wherein the attenuation device is configured to change from a first device state to a second device state in response to applying a common mode voltage to the device output nodes that is either greater than a first reference voltage or less than a second reference voltage that less than the first reference voltage;
   wherein the attenuation device is further configured to cause a first electrical output resistance at each device output node during the first device state; and
   wherein the attenuation device is configured to cause a second electrical output resistance at each device output node during the second device state, wherein the second output resistance is less than the first output resistance;
   wherein the attenuation device comprises an electrical circuit having a first branch and a second branch;
   wherein the first branch extends from the first device output node through a first electrical resistor and a first diode to a first reference voltage node of the circuit and from the second device output node through a second electrical resistor and a second diode to the first reference voltage node of the circuit; and
   wherein the second branch extends from said first device output node through the first resistor and a third diode to a second reference voltage node of the circuit and from said second device output node through the second resistor and a fourth diode to the second reference voltage node.

2. The attenuation device of claim 1, wherein the attenuation device is configured to change from the second device state to the first device state in response to applying a common mode voltage to the device output nodes that is less than the first reference voltage and greater than the second reference voltage.

3. The attenuation device of claim 1, wherein cathodes of the first and second diodes are each coupled to the first reference voltage node and anodes of the third and fourth diodes are each coupled to the second reference voltage node.

4. The attenuation device of claim 3, wherein the first branch comprises a first transistor through which the first and second diodes are switchably coupled to the first reference voltage node, and wherein the second branch comprises a second transistor through which the third and fourth diodes are switchably coupled to the second reference voltage node.

5. An attenuation device for a controller area network ("CAN") transceiver, the attenuation device comprising:
   two device output nodes configured to electrically couple the attenuation device via the device output nodes between two transceiver terminals of the CAN transceiver;
   wherein the attenuation device is configured to change from a first device state to a second device state in response to applying a common mode voltage to the device output nodes that is either greater than a first reference voltage or less than a second reference voltage that less than the first reference voltage;
   wherein the attenuation device is further configured to cause a first electrical output resistance at each device output node during the first device state;
   wherein the attenuation device is configured to cause a second electrical output resistance at each device output node during the second device state, wherein the second output resistance is less than the first output resistance
   wherein the attenuation device is configured to be either enabled or disabled; and
   wherein the attenuation device is configured to perform the change from the first device state to the second device state solely when the attenuation device is enabled, and wherein the attenuation device is configured to be always in the first device state when disabled.

6. The attenuation device of claim 5,
   wherein the attenuation device comprises a control input configured to receive a control signal from the CAN transceiver,
   wherein the control signal is based on a digital input signal receivable by the CAN transceiver;
   and wherein the attenuation device is configured to perform the change from the first device state to the second device state according to the control signal.

7. The attenuation device of claim 6,
   wherein the first branch comprises a first transistor through which the first and second diodes are switchably coupled to the first reference voltage node, and wherein the second branch comprises a second transistor through which the third and fourth diodes are switchably coupled to the second reference voltage node, and
   wherein the attenuation device is configured to control the first and second transistors according to the control signal to either enable or disable the attenuation device.

8. The attenuation device of claim 7, wherein the attenuation device is configured to apply the first reference voltage to the gate of the first transistor and the second reference voltage to the gate of the second transistor upon enabling of the attenuation device.

9. The attenuation device of claim 1, wherein the attenuation device is configured to be either enabled or disabled, and wherein the attenuation device is configured to perform the change from the first device state to the second device state solely when the attenuation device is enabled, and wherein the attenuation device is configured to be always in the first device state when disabled.

10. The attenuation device of claim 9,
    wherein the attenuation device comprises a control input configured to receive a control signal from the CAN transceiver;

wherein the control signal being based on a digital input signal receivable by the CAN transceiver; and wherein the attenuation device is configured to perform the change from the first device state to the second device state according to the control signal.

11. The attenuation device of claim 10,
wherein the electrical circuit of the attenuation device comprises a third branch and a fourth branch;
wherein the third branch comprises a series connection of a third transistor, a third electrical resistor and a fifth diode, the fourth branch comprising a series connection of a fourth transistor, a fourth electrical resistor and a sixth diode;
wherein the attenuation device is configured to control the third and fourth transistors according to the control signal;
wherein the first transistor is coupled to the third branch such that the first transistor is controlled in accordance with a switching state of the third transistor; and
wherein the second transistor is coupled to the fourth branch such that the second transistor is controlled according to a switching state of the fourth transistor.

12. A controller area network ("CAN") transceiver, comprising:
two transceiver terminals configured for connection to signal lines of a CAN bus; and an attenuation device;
wherein the attenuation device comprises two device output nodes;
wherein the attenuation device is electrically coupled between the transceiver terminals of the transceiver via the device output nodes of the attenuation device;
wherein the attenuation device is configured to change from a first device state to a second device state in response to applying a common mode voltage to the device output nodes that is either greater than a first reference voltage or less than a second reference voltage, the second reference voltage being less than the first reference voltage;
wherein the attenuation device is further configured to cause a first electrical output resistance at each device output node during the first device state;
wherein the attenuation device is configured to cause a second electrical output resistance at each device output node during the second device state, wherein the second output resistance is less than the first output resistance;
wherein the attenuation device is configured to be either enabled or disabled;
wherein the attenuation device is configured to perform the change from the first device state to the second device state solely when the attenuation device is enabled; and
wherein the attenuation device is configured to be always in the first device state when disabled.

13. The transceiver of claim 12, wherein the attenuation device is configured to change from the second device state to the first device state in response to applying a common mode voltage to the device output nodes that is less than the first reference voltage and greater than the second reference voltage.

14. The transceiver of claim 13,
wherein the attenuation device comprises a control input configured to receive a control signal from the CAN transceiver, the control signal being based on a digital input signal receivable by the CAN transceiver; and wherein the attenuation device is configured to perform the change from the first device state to the second device state according to the control signal.

15. The transceiver of claim 12, wherein the transceiver has a signal input for receiving a digital input signal, and wherein the transceiver is configured to generate a control signal based on the receivable input signal and to transmit the control signal to the control input of the attenuation device.

16. The transceiver of claim 15,
wherein the transceiver is configured, when the digital input signal represents a bit sequence of a dominant bit and a subsequent recessive bit, to generate a CAN bus signal at the transceiver terminals also representing the bit sequence;
wherein the transceiver is configured to couple a third, electrical resistance at each of the transceiver terminals for the dominant bit;
wherein the transceiver is configured to couple a fourth electrical resistance at each of the transceiver terminals for the recessive bit;
wherein the third resistance is smaller than the fourth resistance;
wherein the second resistance caused by the attenuation device in the second device state at each device node is greater than the third resistance and less than the fourth resistance; and
wherein the transceiver is configured to control the attenuation device via the control signal such that the attenuation device is enabled during a predetermined time period at the beginning of a time interval associated with the recessive bit in the CAN bus signal.

17. A method for of operating an attenuation device that comprises device output nodes configured to electrically couple the attenuation device via the device output nodes between two transceiver terminals of a controller area network ("CAN") transceiver, the method comprising:
sensing a common mode voltage at the device output nodes;
changing from a first device state of the attenuation device to a second device state of the attenuation device in response to the common-mode voltage becoming either greater than a first reference voltage or less than a second reference voltage, the second reference voltage being less than the first reference voltage;
causing a first electrical output resistance at each of the device output nodes when the attenuation device is in the first device state; and
causing a second electrical output resistance at each of the device output nodes when the attenuation device is in the second device state, the second output resistance being less than the first output resistance;
wherein the attenuation device comprises an electrical circuit having a first branch and a second branch;
wherein the first branch extends from the first device output node through a first electrical resistor and a first diode to a first reference voltage node of the circuit and from the second device output node through a second electrical resistor and a second diode to the first reference voltage node of the circuit; and
wherein the second branch extends from said first device output node through the first resistor and a third diode to a second reference voltage node of the circuit and from said second device output node through the second resistor and a fourth diode to the second reference voltage node.

18. The method of claim 17, further comprising: changing from the second device state of the attenuation device to the first device state of the attenuation device in response to the common mode voltage becoming less than the first reference voltage and greater than the second reference voltage.

19. A method of operating an attenuation device that comprises device output nodes configured to electrically couple the attenuation device via the device output nodes between two transceiver terminals of a controller area network ("CAN") transceiver, the method comprising:

sensing a common mode voltage at the device output nodes;

changing from a first device state of the attenuation device to a second device state of the attenuation device in response to the common-mode voltage becoming either greater than a first reference voltage or less than a second reference voltage, the second reference voltage being less than the first reference voltage;

causing a first electrical output resistance at each of the device output nodes when the attenuation device is in the first device state; and causing a second electrical output resistance at each of the device output nodes when the attenuation device is in the second device state, the second output resistance being less than the first output resistance wherein the attenuation device is configured to be either enabled or disabled; and wherein the attenuation device is configured to perform the change from the first device state to the second device state solely when the attenuation device is enabled, and wherein the attenuation device is configured to be always in the first device state when disabled.

* * * * *